(12) United States Patent
Ahmed et al.

(10) Patent No.: US 10,910,165 B2
(45) Date of Patent: Feb. 2, 2021

(54) PROCESS, A STRUCTURE, AND A SUPERCAPACITOR

(71) Applicant: University of Technology Sydney, Ultimo (AU)

(72) Inventors: Mohsin Ahmed, Narayangong (BD); Francesca Iacopi, West End (AU)

(73) Assignee: UNIVERSITY OF TECHNOLOGY SYDNEY, Ultimo (AU)

( * ) Notice: Subject to any disclaimer, the term of this patent is extended or adjusted under 35 U.S.C. 154(b) by 0 days.

(21) Appl. No.: 15/556,242

(22) PCT Filed: Mar. 4, 2016

(86) PCT No.: PCT/AU2016/050152
§ 371 (c)(1),
(2) Date: Sep. 6, 2017

(87) PCT Pub. No.: WO2016/141423
PCT Pub. Date: Sep. 15, 2016

(65) Prior Publication Data
US 2018/0247772 A1  Aug. 30, 2018

(30) Foreign Application Priority Data

Mar. 6, 2015 (AU) .................... 2015900810

(51) Int. Cl.
*H01G 11/36* (2013.01)
*H01G 11/26* (2013.01)
(Continued)

(52) U.S. Cl.
CPC ........... *H01G 11/36* (2013.01); *C01B 32/184* (2017.08); *C23C 14/185* (2013.01); *C23C 14/34* (2013.01);
(Continued)

(58) Field of Classification Search
CPC ........ H01G 11/36; H01G 11/26; H01G 11/56; H01G 11/34; H01G 11/86; C23F 1/30; C23C 14/34; C30B 29/36
See application file for complete search history.

(56) References Cited

U.S. PATENT DOCUMENTS

| 2012/0170171 A1* | 7/2012 | Lee | ............... H01G 11/36 361/502 |
| 2013/0230751 A1* | 9/2013 | Shaw | ............... H01G 11/12 429/72 |

(Continued)

FOREIGN PATENT DOCUMENTS

| GB | 2502533 A | * 12/2013 | ............ B82Y 30/00 |
| JP | 2011178644 A | 9/2011 | |

(Continued)

OTHER PUBLICATIONS

Liu et al., Graphitization of n-type polycrystalline silicon carbide for on-chip supercapacitor application, Appl. Phys. Lett. 99, 112104 (Year: 2011).*

(Continued)

*Primary Examiner* — David M Sinclair
(74) *Attorney, Agent, or Firm* — Knobbe, Martens, Olson & Bear, LLP

(57) ABSTRACT

A process for forming high surface area graphene structures includes: depositing at least one metal on a surface of silicon carbide; heating the at least one metal and the silicon carbide to cause at least one of the metals to react with a portion of the silicon carbide to form silicide regions extending into an unreacted portion of the silicon carbide and graphene disposed between the silicide regions and the unreacted portion of the silicon carbide; and removing the silicide regions to provide a silicon carbide structure having a highly irregular surface and a surface layer of graphene.

7 Claims, 15 Drawing Sheets

(51) Int. Cl.

| | |
|---|---|
| *H01G 11/56* | (2013.01) |
| *C01B 32/184* | (2017.01) |
| *C23C 14/18* | (2006.01) |
| *C23C 14/58* | (2006.01) |
| *C23C 16/32* | (2006.01) |
| *H01G 11/86* | (2013.01) |
| *H01G 11/28* | (2013.01) |
| *H01G 11/68* | (2013.01) |
| *H01G 11/32* | (2013.01) |
| *C23C 14/34* | (2006.01) |
| *C23C 28/00* | (2006.01) |
| *C23F 1/30* | (2006.01) |
| *C30B 25/18* | (2006.01) |
| *C30B 29/36* | (2006.01) |
| *H01G 11/34* | (2013.01) |
| *B82Y 30/00* | (2011.01) |
| *B82Y 40/00* | (2011.01) |

(52) U.S. Cl.
CPC ...... *C23C 14/5806* (2013.01); *C23C 14/5873* (2013.01); *C23C 16/325* (2013.01); *C23C 28/322* (2013.01); *C23C 28/341* (2013.01); *C23F 1/30* (2013.01); *C30B 25/18* (2013.01); *C30B 29/36* (2013.01); *H01G 11/26* (2013.01); *H01G 11/28* (2013.01); *H01G 11/32* (2013.01); *H01G 11/34* (2013.01); *H01G 11/68* (2013.01); *H01G 11/86* (2013.01); *B82Y 30/00* (2013.01); *B82Y 40/00* (2013.01); *H01G 11/56* (2013.01); *Y02E 60/13* (2013.01); *Y10S 977/734* (2013.01); *Y10S 977/842* (2013.01); *Y10S 977/948* (2013.01)

(56) References Cited

U.S. PATENT DOCUMENTS

| | | | |
|---|---|---|---|
| 2014/0017883 A1* | 1/2014 | Dal | H01L 21/02378 438/478 |
| 2014/0141600 A1* | 5/2014 | Lee | H01L 21/0242 438/479 |
| 2014/0175458 A1 | 6/2014 | Ahn et al. | |
| 2014/0367642 A1 | 12/2014 | Guo et al. | |
| 2015/0104634 A1* | 4/2015 | Lee | C01B 32/182 428/312.8 |

FOREIGN PATENT DOCUMENTS

| | | |
|---|---|---|
| WO | WO 2013/180662 A1 | 12/2013 |
| WO | WO 2015/035465 A1 | 3/2015 |

OTHER PUBLICATIONS

Ahmed et al.; A thin film approach for SiC-derived graphene as an on-chip electrode for supercapacitors, Nanotechnology 26, 434005 (Year: 2015).*

Cunning et al.; Graphitized silicon carbide microbeams: wafer-level, self-aligned graphene on silicon wafers, Nanotechnology 25, 325301 (Year: 2014).*

Goss et al., Local solid phase growth of few-layer graphene on silicon carbide from nickel silicide supersaturated with carbon, 2013, Journal of Applied Physics, 113, 114309 (Year: 2013).*

Macháčet al., Synthesis of graphene on SiC substrate via Ni-silicidation reactions, 2012, Thin Solid Films, 520, 5215-5218 (Year: 2012).*

Extended European Search Report in European Application No. 16 760 926.2, dated Oct. 11, 2018.

* cited by examiner

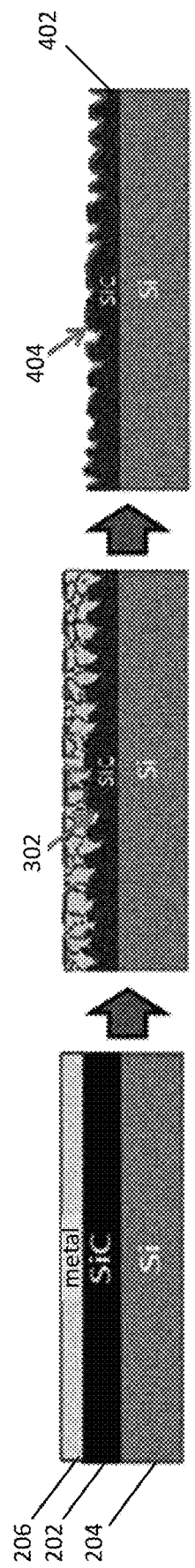

CV curve

Charge-discharge curve

PROCESS, A STRUCTURE, AND A SUPERCAPACITOR

TECHNICAL FIELD

The present invention relates to high surface area structures and supercapacitors incorporating high surface area structures, and processes for producing high surface area graphene structures and supercapacitors.

BACKGROUND

It is desired to alleviate one or more difficulties of the prior art, or to at least provide a useful alternative.

SUMMARY

In accordance with some embodiments of the present invention, there is provided a process for forming high surface area graphene structures, the process including:
  depositing at least one metal on a surface of silicon carbide;
  heating the at least one metal and the silicon carbide to cause at least one of the metals to react with a portion of the silicon carbide to form silicide regions extending into an unreacted portion of the silicon carbide and graphene disposed between the silicide regions and the unreacted portion of the silicon carbide; and
  removing the silicide regions to provide a silicon carbide structure having a highly irregular surface and a surface layer of graphene.

In some embodiments, the silicon carbide is initially in the form of a thin film of silicon carbide supported by a substrate.

In some embodiments, the at least one metal includes nickel. In some embodiments, the at least one metal is only one metal.

In some embodiments, the process includes patterning the thin film of silicon carbide to form mutually spaced electrodes. In some embodiments, the electrodes are in the form of interdigitated finger electrodes.

In some embodiments, the process includes introducing an electrolyte into a region between the mutually spaced electrodes to form a supercapacitor.

In some embodiments, the electrolyte is a gel electrolyte.

In accordance with some embodiments of the present invention, there is provided a structure formed by any one of the above processes. In accordance with some embodiments of the present invention, there is provided a supercapacitor including the structure.

In accordance with some embodiments of the present invention, there is provided a high surface area structure, including a silicon carbide body having a highly non-planar surface and a layer of graphene disposed on the silicon carbide surface.

In accordance with some embodiments of the present invention, there is provided a supercapacitor, including one or more pairs of mutually spaced silicon carbide electrodes, each said electrode having a highly non-planar surface and a layer of graphene disposed on the silicon carbide surface.

Also described herein is a method, including:
  depositing one or more metals on a surface of a body of silicon carbide;
  heating the one or more metals and the body of silicon carbide to cause at least one of the metals to react with silicon carbide of the body to form silicide regions extending into the body of silicon carbide and graphene disposed between the silicide regions and the silicon carbide; and
  removing the silicide regions to provide a silicon carbide structure having a highly non-planar surface with a surface layer of graphene.

In some embodiments, the body of silicon carbide is in the form of a thin film of silicon carbide supported by a substrate.

In some embodiments, the method includes patterning the thin film of silicon carbide to form electrodes of a capacitor.

In some embodiments, the electrodes of the capacitor are in the form of interdigitated finger electrodes.

In some embodiments, the method includes forming a supercapacitor from the graphene structure.

In some embodiments, the one or more metal includes nickel.

In some embodiments, the one or more metals is a single metal.

In accordance with some embodiments of the present invention, there is provided a structure, including a silicon carbide body having a highly non-planar surface and a layer of graphene disposed on the silicon carbide surface.

In accordance with some embodiments of the present invention, there is provided a supercapacitor, including silicon carbide electrodes having a highly non-planar surface and a layer of graphene disposed on the silicon carbide surface.

BRIEF DESCRIPTION OF THE DRAWINGS

Some embodiments of the present invention are hereinafter described, by way of example only, with reference to the accompanying drawings, wherein:

FIGS. 2 to 4 are schematic cross-sectional side views of a wafer sample at different steps of the process of FIG. 1, illustrating the formation of graphene on a highly corrugated and porous SiC surface;

DETAILED DESCRIPTION

The described embodiments of the present invention include a process for forming graphene structures, and a process for forming supercapacitors incorporating those graphene structures. The graphene structures formed by the described processes are characterised by having highly non-planar or "rough" surfaces that provide a relatively high surface area per unit volume or footprint, making them advantageous for use in many applications requiring high surface area structures, including, for example, many types of sensors and capacitors.

In particular, the described processes include processes for forming electrochemical capacitors or capacitor structures having very high capacitances, known in the art as "supercapacitors". Supercapacitors can be used with or in place of batteries, and they can be charged and discharged much faster than batteries (e.g., they can be fully charged in just a few seconds). They are also less affected by charging and discharging than rechargeable batteries, and thus are preferred for applications requiring many charge-discharge cycles.

Supercapacitors are capable of an order of magnitude larger (10,000 W kg$^{-1}$) power density than lithium-ion batteries, and two orders of magnitude higher (10 Wh kg$^{-1}$) energy density than electrolytic capacitors. They also do not suffer from the relatively slow power output and limited life cycle of lithium-ion rechargeable batteries.

The graphene structures described herein have not only a large surface area, but also low sheet resistance and high conductivity. Moreover, the graphene structures are formed on a silicon carbide (SiC) surface, SiC being an extremely robust refractory material suitable for use in harsh and extreme environments. The described processes can also be integrated into existing semiconductor manufacturing processes, allowing the graphene structures and supercapacitors to be combined with other structures and devices on a single die, including integrated circuits, in order to provide integrated or 'on-chip' energy storage, offering advantageous miniaturisation prospects for a number of integrated microsystems such as sensors and energy harvesters, for example.

Figure 1:
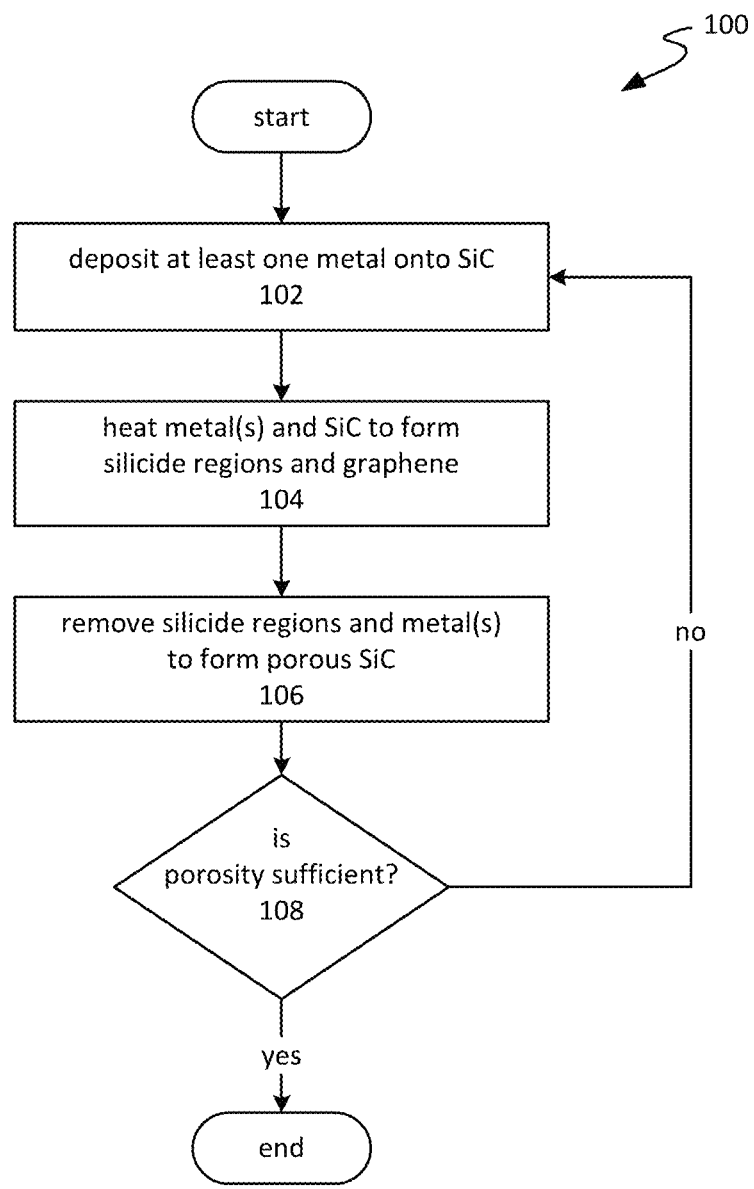
FIG. 1 is a flow diagram of a process for forming a structure in accordance with some embodiments of the present invention.

As shown in the flow diagram of FIG. 1, a process 100 for producing graphene structures begins by depositing one or more metals onto a body of silicon carbide (SiC) at step 102. The metals can be deposited using any standard metal deposition process known to those skilled in the art, including sputtering and thermal evaporation, for example. The body of SiC may be in the form of a bulk sample or wafer, or alternatively may be a thin film or layer attached to a supporting substrate. The thin film or layer of SiC may be crystalline or amorphous. The substrate may be a single-crystal substrate. In the described embodiments, the body of SiC is a thin film 202 of single-crystal SiC, and the supporting substrate is a silicon (Si) substrate 204 in the form of a standard single-crystal silicon wafer, but this need not be the case in other embodiments. The one or more metals are deposited in the form of a thin layer or film 206.

At step 104, the metal(s) and the SiC body are heated to cause the metal(s) to react with the SiC to form one or more silicide regions and graphene layers disposed at the interface between the silicide regions and the unreacted SiC. The general phenomenon by which this occurs is described in International Patent Application No. PCT/AU2014/050218, entitled Process for Forming Graphene Layers on Silicon Carbide, the entirety of which is hereby expressly incorporated herein by reference. Metals such as nickel (Ni), cobalt (Co), titanium (Ti), tungsten (W), and iron (Fe), for example, can be deposited and reacted with SiC as described above to form stable silicides, typically at temperatures of at least 1000° C.

However, the inventors have determined that the morphology of the silicide regions is highly dependent upon the particular metal(s) that is/are deposited. In particular, some metals or combinations of metals (a mixture of nickel (Ni) and copper (Cu), for example) form a relatively uniform and smooth layer, whereas other metals result in the formation of silicide regions having a highly irregular and complex morphology. In accordance with the present invention, at least one metal is selected such that, when reacted as described above, it forms spatially irregular or non-uniform silicide regions 302 that intermittently penetrate or protrude into the SiC layer or body, as shown in FIG. 3, and as described in more detail below. For any given metal of interest, it is well within the capability of those of ordinary skill in the art to simply deposit the metal on a SiC surface, apply thermal processing as described above, and assess the resulting surface topography using any suitable standard assessment method known to those skilled in the art, including those described herein (e.g., electron microscopy).

The inventors have determined that the metal nickel (Ni) is a particularly suitable choice for this purpose, although other metals may be used in some embodiments. Nickel is a fast diffusing element in SiC, and is found to be efficient at dissociating Si—C bonds and forming morphologically non-uniform nickel silicide regions and graphitic carbon. At least some of the released carbon (from SiC) is graphitized at the SiC/Ni interface, i.e. deposits as graphene. The overall reaction can be simplified as follows:

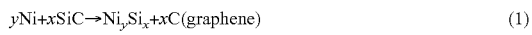

$$y\text{Ni} + x\text{SiC} \rightarrow \text{Ni}_y\text{Si}_x + x\text{C(graphene)} \quad (1)$$

(where x,y=1-2)

Having formed these silicide protrusions, they are removed (e.g., by an etching process) at step 106, together with any remaining metal. Due to the highly non-uniform morphology of the silicide regions, the surface of the remaining unreacted SiC has a correspondingly rough and non-uniform morphology, as shown in FIG. 4, and can even be described as being porous and/or as having a highly non-planar, complex or rough surface. However, due to the formation of graphene at the interface between the SiC and the silicide regions at step 104, the result of this step is a body 402 of SiC coated with a continuous layer of graphene 404 having a rough or porous surface, and therefore a relatively large surface area per unit volume or footprint in plan view. Thus the deposited metal(s) can be considered to induce roughness and porosity of the surface of the SiC body by forming morphologically non-uniform silicides (during the annealing process) that are subsequently removed.

For the sake of completeness, if the SiC is completely reacted, then the graphene layers can still remain, but are of poorer quality than when there is still some remaining SiC.

As described above, the resulting structure can be used for a wide variety of applications, and is particularly well suited for applications requiring a large surface area, including sensors and capacitors, for example. Depending on the specific requirements of any given application, the degree of porosity or surface roughness can be tuned, tailored, or otherwise determined as required, by simply repeating steps 102 to 106 any number of times until the porosity or surface roughness is sufficient for the desired application (as assessed at step 108).

As described below, this graphene layer has a high conductivity and a large surface area relative to its footprint, making it particularly suitable for use as the mutually spaced electrodes or 'plates' (notwithstanding that they are non-planar) of a capacitor.

Figure 5:
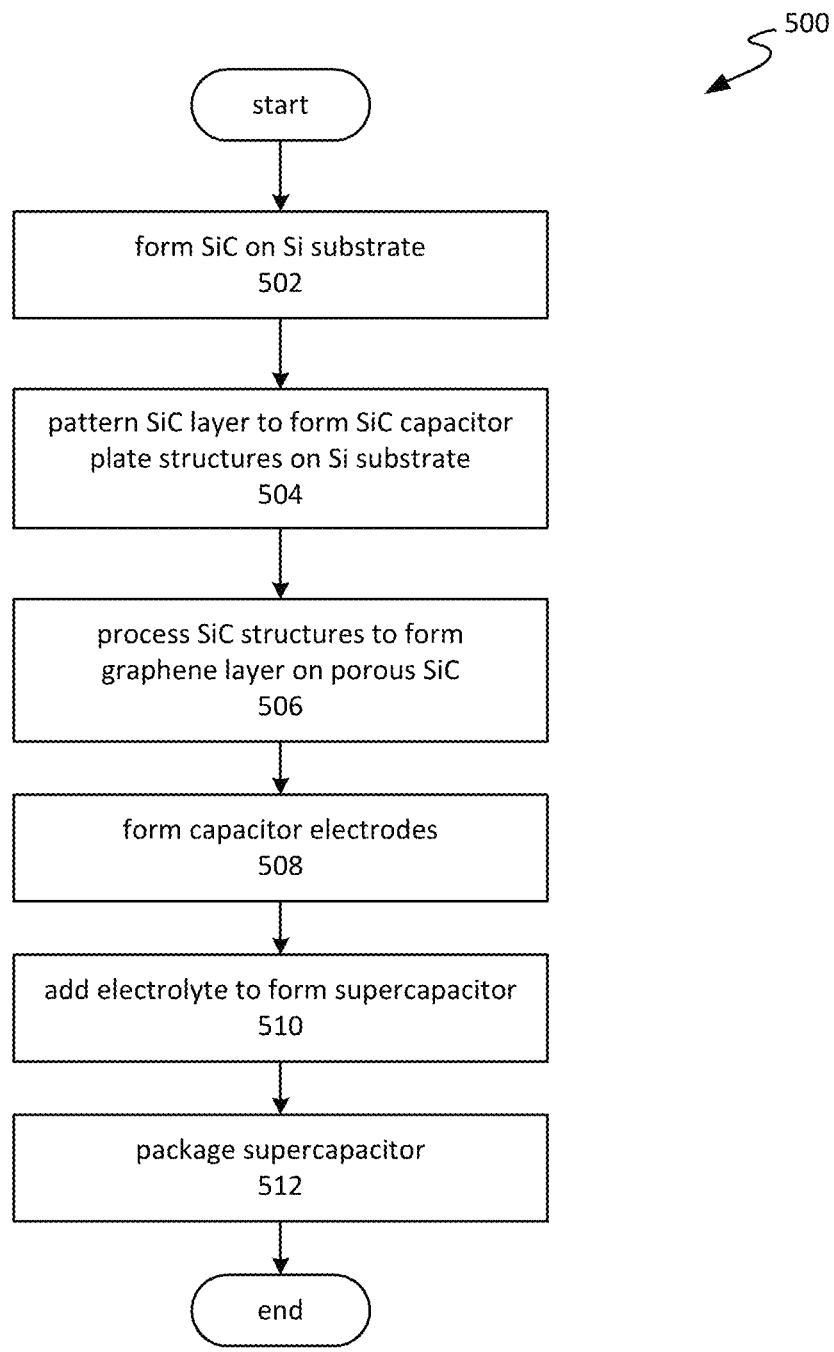
FIG. 5 is a flow diagram of a process for forming a supercapacitor structure in accordance with some embodiments of the present invention.
Figure 6:
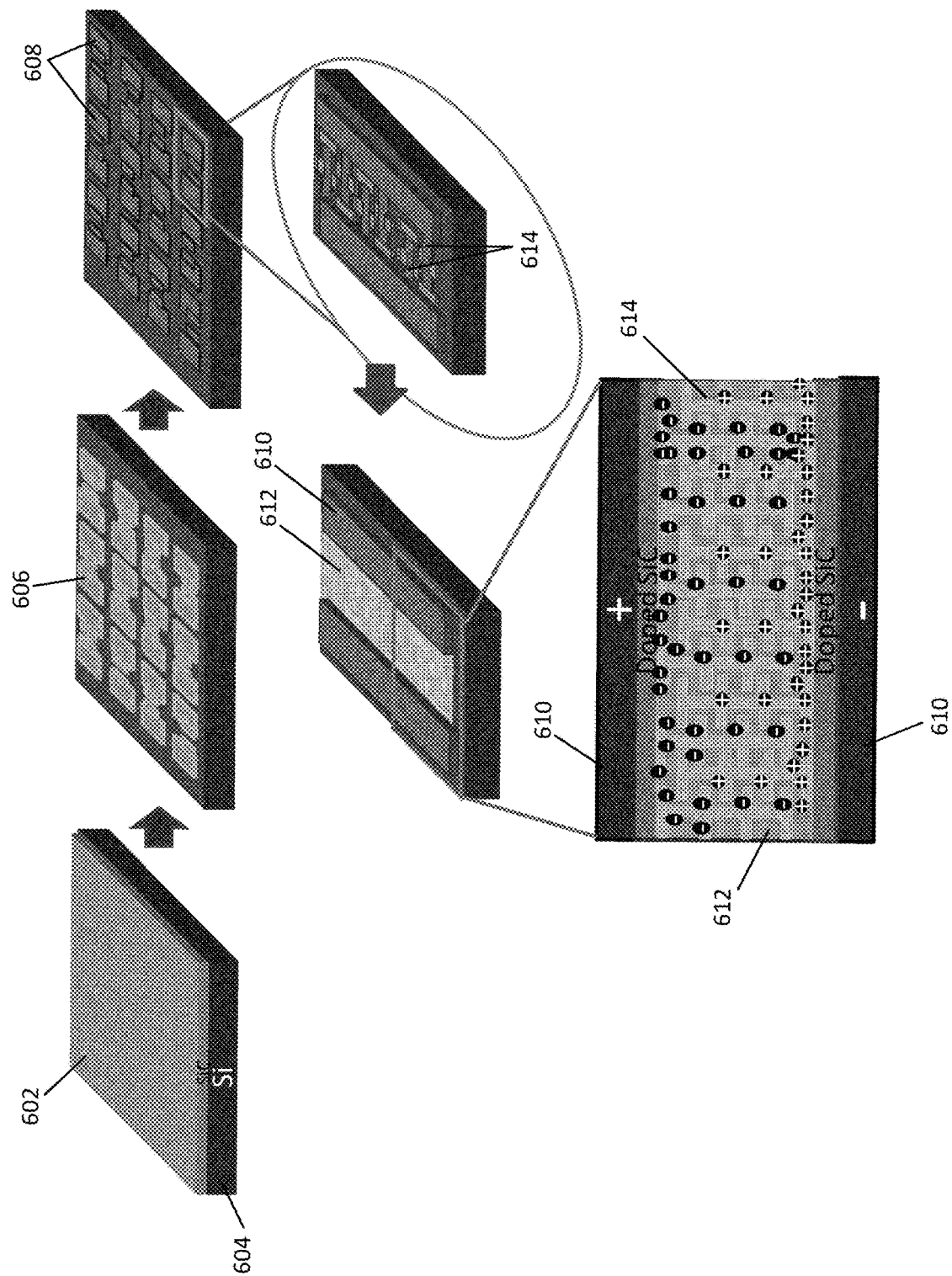
FIG. 6 includes schematic views of a SiC on Si sample at various steps of the process of FIG. 5.

FIG. 5 is a flow diagram of a process 500 for producing a supercapacitor. The process begins at step 502 by forming a layer of SiC 602 on a Si wafer or substrate 604, as shown in FIG. 6. At step 504, the SiC layer 602 is patterned (e.g., using standard lithography and subtractive processes known to those skilled in the art) in order to remove selected regions of the SiC layer 602 so that the remaining SiC is in the form of mutually spaced regions or islands 606 of SiC on the Si substrate 604. As described further below, these SiC regions or islands 602 constitute an array of capacitor structures, with each capacitor structure including at least one pair of mutually spaced capacitor electrodes or 'plates'.

At step 506, these SiC islands 606 are processed using the process 100 described above in order to react at least a portion of each SiC island 606 with at least one metal to form spatially non-uniform silicide regions, and to remove these silicide regions and any remaining metal such that the surfaces of the remaining SiC structures 608 are porous, highly textured or rough, and have a surface coating of graphene, as described above and shown in FIG. 4.

At step 508, electrically conductive electrodes 610 are formed on selected portions of each capacitor structure 602 in order to provide the mutually spaced electrodes or 'plates' of each capacitor. At step 510, an aqueous or gel electrolyte (for example, H2S04 in a PVA gel) is added to the regions between the capacitor plates 612, so that the structure can function as an electrochemical capacitor or 'supercapacitor'. As shown in FIG. 6, in the described embodiments the capacitor 'plates' of each capacitor structure are in the general form of interdigitated finger electrodes 614, a general structure commonly used in the art to provide a large surface area. However, in accordance of the present invention, each finger electrode 614 is composed of SiC having a highly textured or rough surface (and thus having a high surface area) coated with electrically conductive graphene.

EXAMPLE I

To demonstrate the properties of the porous graphene on SiC structures formed using the processes described herein, a (~300 nm thick) 3C—SiC layer was grown on (100) Si wafers via calcination at 1000° C. with SiH$_4$ (99.9994%) and C$_3$H$_6$ (99.9999%) supplied alternatively into a horizontal hot wall, low-pressure chemical vapour deposition (LPCVD) furnace. The resulting crystalline 3C—SiC layer was found to have an unintentional doping concentration of $10^{16}$-$10^{17}$ cm$^{-3}$ n-type carriers.

The resulting SiC/Si wafers were then coated with a thin (~2 nm) nickel film by DC Ar$^+$ ion sputtering using a deposition current of 100 mA at a base pressure of $8 \times 10^{-2}$ mbar. The wafers were then annealed in a flowing (20 sccm) N$_2$ atmosphere at 1000-1200° C., some by conventional furnace annealing for a period of 2 hours (denoted "FA", temperature ramping at ~25° C. min$^{-1}$), and others by rapid thermal annealing for only four minutes (denoted "RTA", temperature ramping at ~5° C. s$^{-1}$). For convenience of reference, samples with different annealing conditions are denoted as F$_1$ (1000° C. via FA), F$_2$ (1200° C. via FA), R$_1$ (1000° C. via RTA), and R$_2$ (1100° C. via RTA).

The annealed wafers were then etched using a Freckle solution (70:10:5:5:10—85% H$_3$PO$_4$:Glacial acetic acid: 70% HNO$_3$:50% HBF$_4$:H$_2$O) to remove the resulting nickel silicides and any unreacted nickel, using extreme care to retain the graphene layers.

All the samples were characterized by Raman Spectroscopy on a Renishaw spectrometer with a laser excitation at 514 nm on four sites of each sample. Raman spectroscopy is a powerful and non-destructive technique to assess the graphitic structure by comparing the D and G Raman bands.

Figure 7:
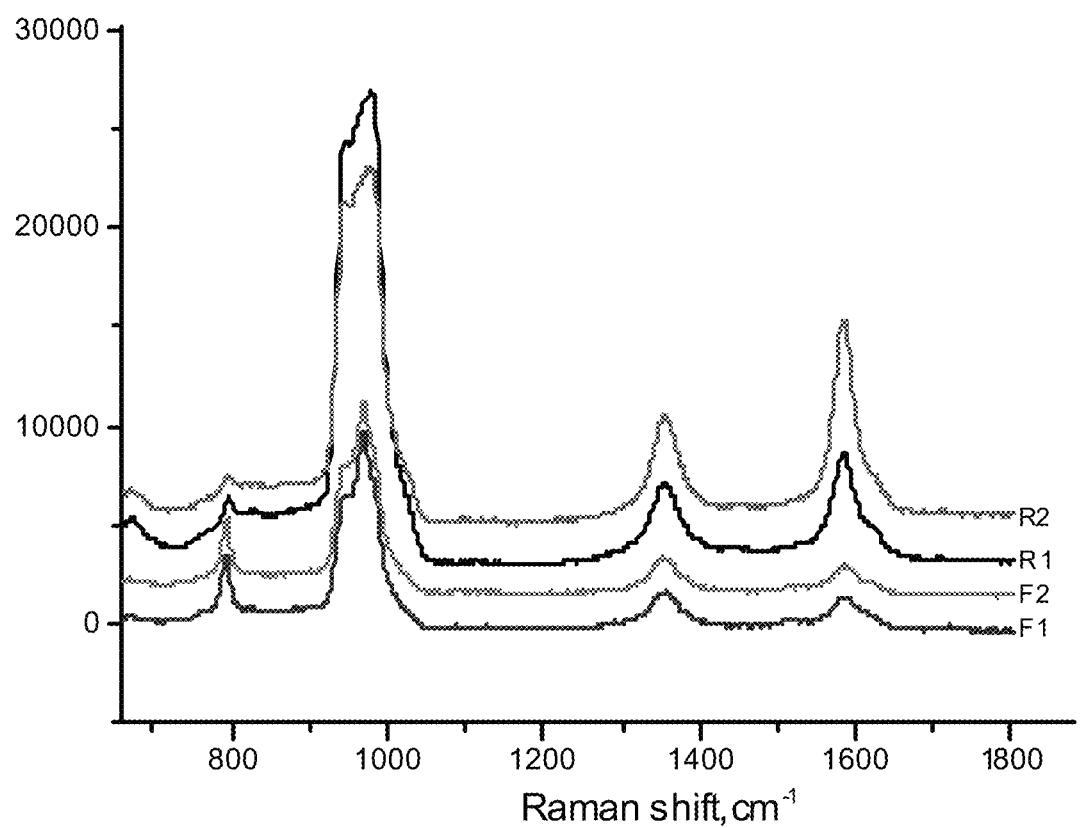
FIG. 7 is a graph showing Raman spectra of samples $F_1$, $F_2$, $R_1$ and $R_2$ (see text for details)

FIG. 7 shows the Raman spectra of the four types of samples, each having four major peaks. The peaks at ~790 and 965 cm$^{-1}$ are typical SiC peaks from the template/substrate SiC/Si wafers. The enriched D and G bands are located at ~1350 and ~1580 cm$^{-1}$, respectively. The G band reveals the phonon vibration in the E$_{2g}$ mode, while the D band corresponds to the defects and disordered nature of the sp$^2$ carbon network. The intensity ratio of the D and G peaks (I$_D$/I$_G$) is thus a measure of the degree of reduction of the sp$^2$ structure and associated defects. Accordingly, a higher value of I$_D$/I$_G$ indicates a more defective crystalline structure.

For example, SiC-derived carbon powders processed by halogenation have a small pore size with a high value of I$_D$/I$_G$, indicating defective sites in abundance. In contrast, the graphitized carbon (graphene) in the samples prepared as described above is characterised by relatively low I$_D$/I$_G$ values (0.7-1.2, see Table 1 below), suggesting that the graphene produced as described above is of relatively high quality with relatively few defects. It is apparent from the values in the table that the annealing procedure makes a significant difference in the amount of defects and the final thickness of the graphene layers.

opposed to the SiC bulk. By solving t from the equation, the number of graphene layers for each sample was calculated to be 8.3, 13.7, 14.1, and 24.8 for $F_1$, $F_2$, $R_1$ and $R_2$, respectively, as shown in Table 1.

To investigate the surface morphology, samples were examined by Scanning Electron Microscopy (SEM) using a

TABLE 1

Sheet resistance, Raman ID/IG ratio, RMS roughness, number of graphene layers, area capacitance, and gravimetric capacitance of samples F1, F2, R1, R2 and reference SiC/Si samples.

| Samples | Sheet Resistance (Ω) | Raman $I_D/I_G$ | RMS Roughness (nm) | Number of Graphene Layers | Area Capacitance* (µF cm$^{-2}$) | Gravimetric Capacitance* (F g$^{-1}$) |
|---|---|---|---|---|---|---|
| $F_1$ | 680 ± 10 | 1.2 ± 0.1[#] | 23 ± 2 | 8.3 ± 0.5 | 31.8 | 50.8 |
| $F_2$ | 80 ± 10 | 1.2 ± 0.1 | 41 ± 2 | 13.7 ± 0.5 | 37.5 | 36.2 |
| $R_1$ | 80 ± 10 | 0.7 ± 0.1 | 66 ± 2 | 14.1 ± 0.5 | 69.5 | 65.0 |
| $R_2$ | 236 ± 10 | 0.7 ± 0.1 | 70 ± 2 | 24.8 ± 0.5 | 34.4 | 18.3 |
| Reference SiC/Si | 4-7 × 10$^3$ | N/A | 3.8 ± 0.8 | N/A | 6.2 | N/A |

*Capacitance obtained at a scan rate of 5 mV s$^{-1}$
[#]uncertainty values represent the variation in measured values over 4 sites per sample The chemical compositions of the surface regions of the samples were determined by X-ray Photoelectron Spectrometry (XPS) in an ultrahigh vacuum (UHV) system using a non-monochromatic Mg Kα (1253.6 eV) X-ray source (DAR 400, Omicron Nanotechnology) operating at a power of 300 W, at an incident angle of 65° to the sample surface, using a 125 mm hemispherical electron energy analyser (Sphera II, 7 channels detector, Omicron Nanotechnology). The resulting photoelectrons were collected at a take-off angle of 90°. Survey scans were taken at an analyser pass energy of 50 eV, and high resolution scans at an analyser pass energy of 20 eV. The survey scans were carried out with 0.5 eV steps and a dwell time of 0.2 s, whereas high-resolution scans were run with 0.2 eV steps and 0.2 s dwell time. The pressure in the analysis chamber during XPS scans was kept below 4.0×10$^{-10}$ mbar.

Figure 8:
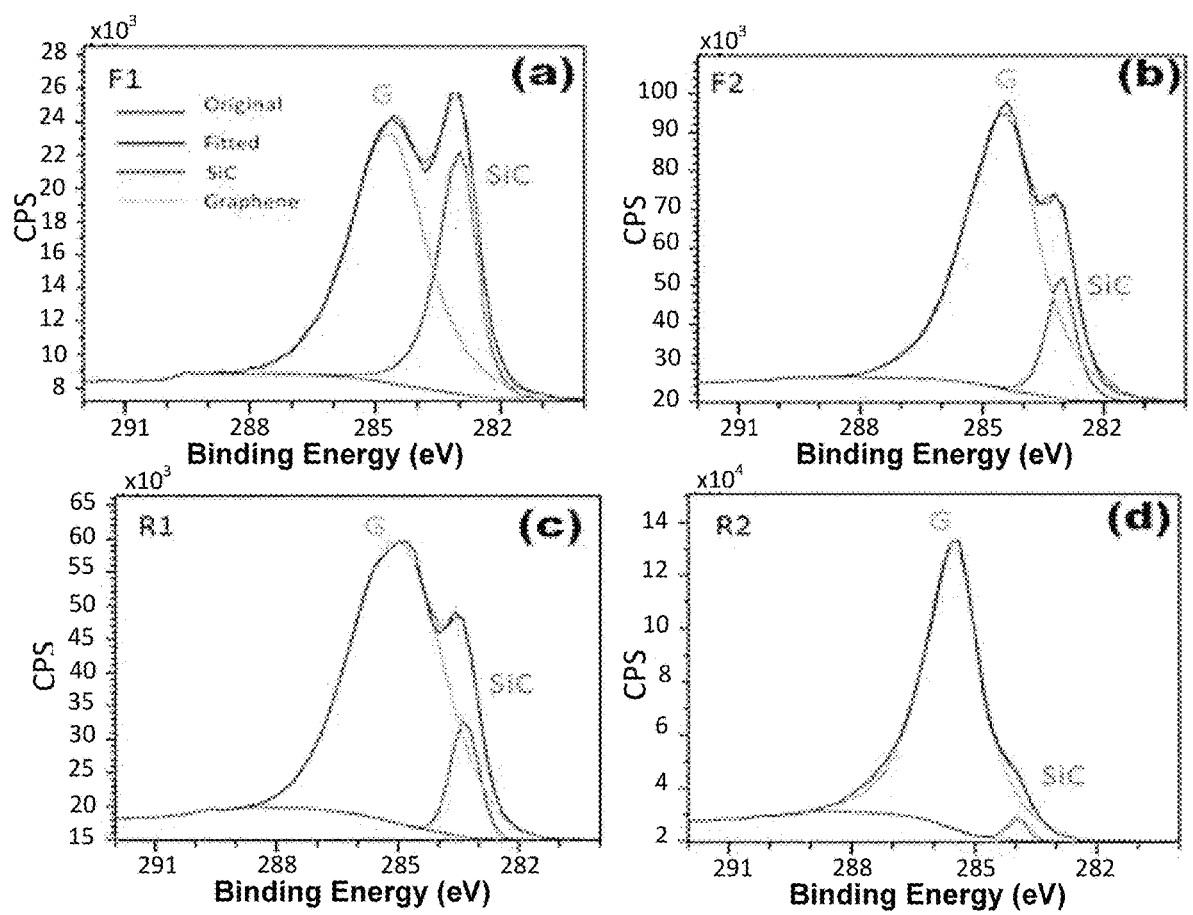
FIG. 8 includes four high-resolution XPS C1s spectra of (a) $F_1$, (b) $F_2$, (c) $R_1$ and (d) $R_2$ samples, showing the constituent graphene and SiC peaks determined by curve fitting.
Figure 9:
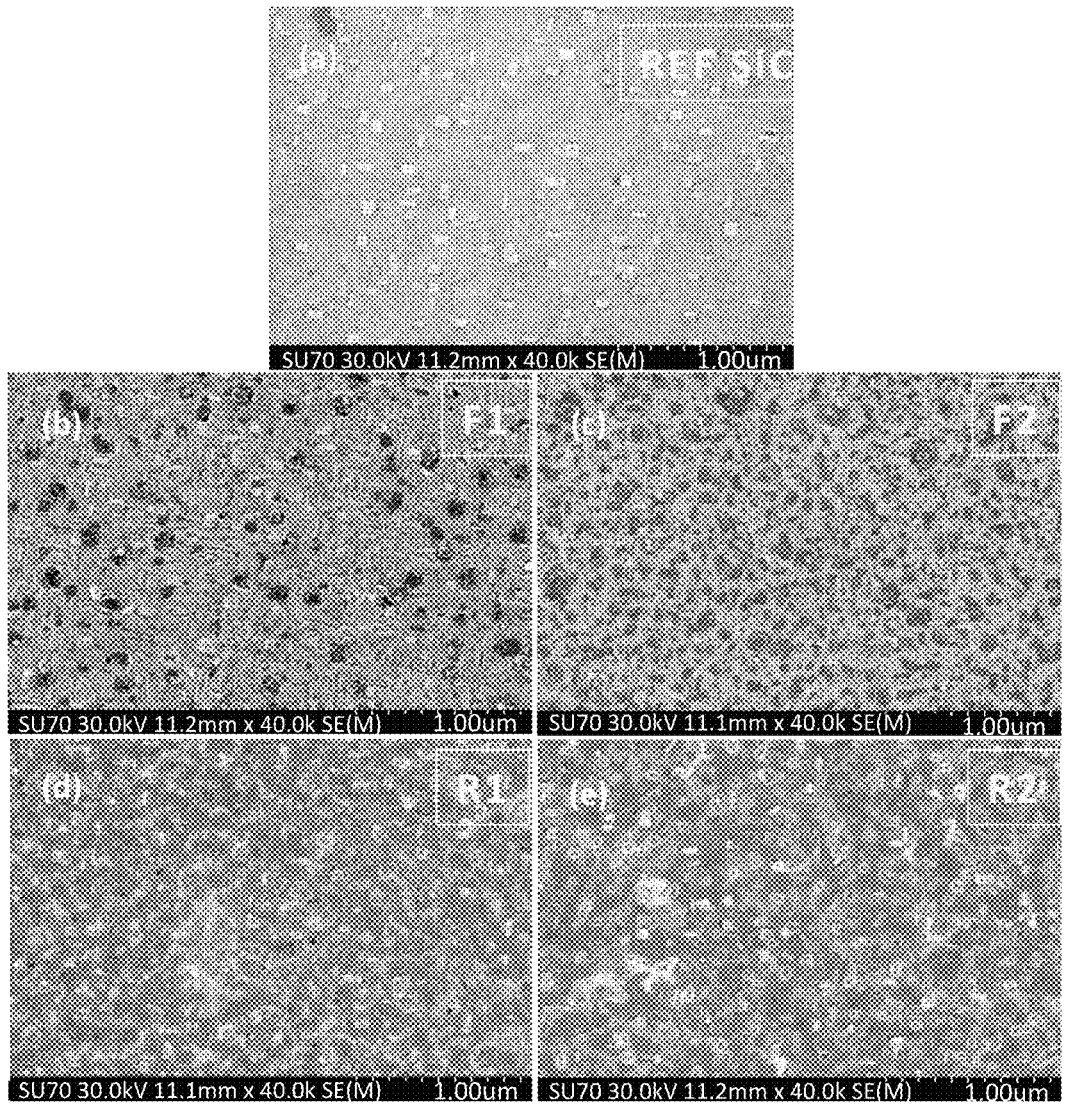
FIG. 9 includes five SEM images of (a) a reference, unprocessed SiC film on Si, and graphene samples (b) $F_1$, (c) $F_2$, (d) $R_1$, (e) $R_2$, showing extensive pitting after graphene formation.

High resolution XPS spectra of the C1s peak of all samples are shown in FIG. 8, where the C1s peak has been de-convoluted into two fitting peaks. The enriched graphene layer can be identified at ~285 eV as graphitic carbon, while the carbidic Si—C bonds located at ~283 eV are attributed to the underlying SiC.

To quantitatively determine the number of produced graphene layers (t) on the SiC/Si wafer, the intensity ratio of the photoelectron peaks corresponding to graphene ($N_G$) and SiC ($N_R$, as a reference) in the high resolution XPS spectra was calculated as follows, given the interlayer spacing of 3.35 Å for graphene:

$$\frac{N_G}{N_R} = \frac{T(E_G)\rho'C_G\lambda'(E_G)\left[1 - \exp\left(-\frac{t}{\lambda'(E_G)}\right)\right]}{T(E_R)\rho C_R\lambda(E_R)\exp\left(-\frac{t}{\lambda(E_R)}\right)} \cdot F \quad (2)$$

where T represents the transmission function of the analyser; E represents the photoelectron kinetic energy; ρ represents the atomic density of the materials; C represents the differential cross section; and λ represents the inelastic mean free path from the TPP-2M formula. Taking photoelectron diffraction into account, a geometrical correction factor, F, is also included in the equation. The superscript ' indicates quantities corresponding to the graphene overlayer as JSM-6610LV facility. FIG. 7 includes five plan view SEM images, showing that the initial surface of the unprocessed SiC (FIG. 7(a)) as a high density of rectangular-shaped hillocks, these being a typical signature of stacking faults with two-fold symmetry on (100) surfaces. The surface of all of the graphene samples (FIG. 7 (b), (c), (d), (e)) appears much rougher, with a dense pitting pattern. This rugged morphology is a result of the diffusion of nickel into the SiC layer during annealing, and the formation of localized silicide regions that were subsequently etched away, as schematically shown in FIGS. 2 to 4. The resulting graphene layer generally follows the rough or rugged surface conformally.

Transmission Electron Microscopy (TEM) was used to generate cross-sectional images of the samples. TEM samples were prepared using a Focused Ion Beam (FIB) lift-out technique. Prior to ion milling, the samples were protected with a 5 keV e-beam deposited Pt cap to preserve the initial surface integrity. The samples were then prepared by FIB milling with a Ga ion beam at 30 keV to a thickness of ~1 µm and then polished using an Ar ion beam at 500 eV to remove the Ga ion damage and to obtain electron transparency for high resolution imaging. Then the samples were inserted into an FEI Titan Cs corrected TEM operated at 80 keV.

Figure 10:
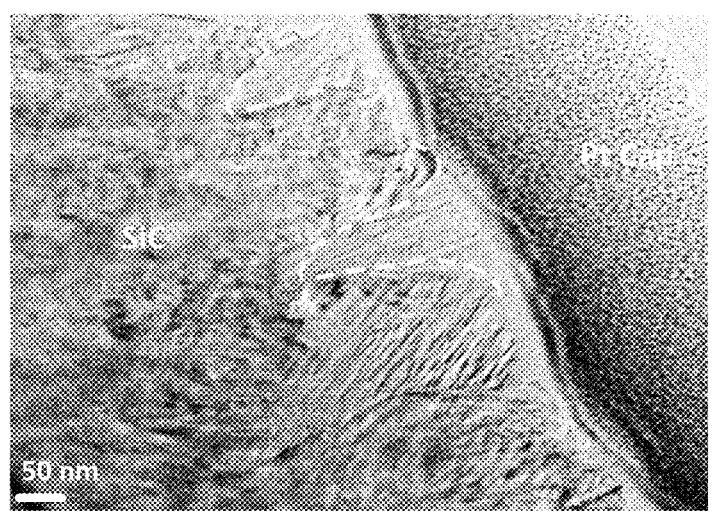
FIG. 10 is a cross-sectional TEM image showing the top SiC surface after nickel-assisted graphitisation (sample F2), the white dotted line indicating the SiC surface profile in the pits, underneath the protective Pt cap added during sample preparation.

FIG. 10 is a cross-sectional TEM image of an $F_2$ sample, showing the surface morphology of the remaining SiC after graphitisation. The platinum capping layer deposited on top of the sample to preserve the surface under FIB has filled the pits in the SiC surface, as indicated by the white dotted line in FIG. 8, which therefore represents the actual SiC surface profile.

Additionally, further away from the surface, several dark areas with a size in the range of ~30-50 nm of nanometers are found, showing that some of the pores are formed deeper in the SiC film.

Figure 11:
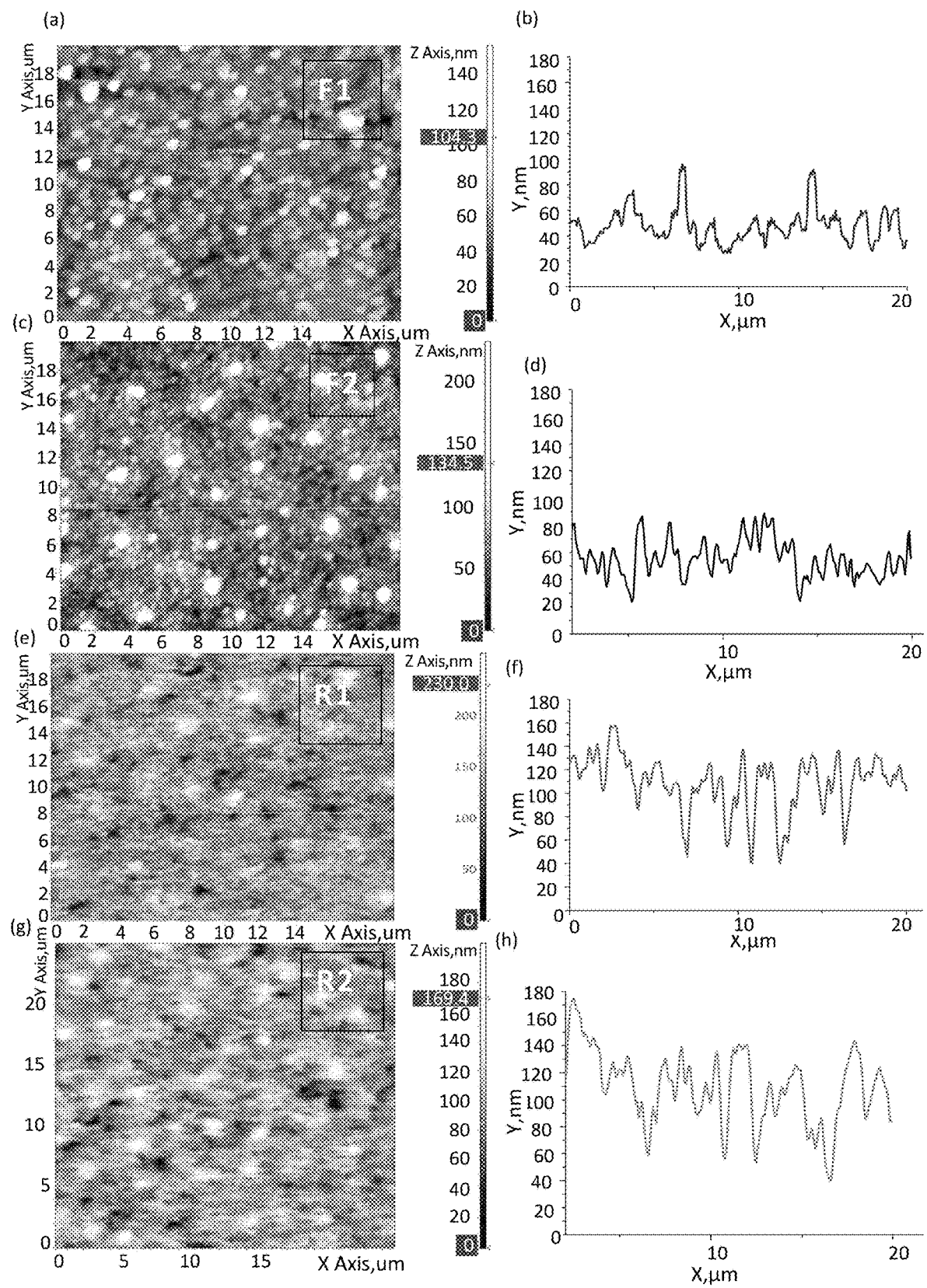
FIG. 11 includes four plan view AFM images of samples (a) $F_1$, (c) $F_2$, (e) $R_1$ and (g) $R_2$, together with their corresponding surface line scan profiles for (b) $F_1$, (d) $F_2$, (f) $R_1$ and (h) $R_2$.

A NT-MDT Integra spectra system was used to measure the surface texture on the samples by Atomic Force Microscopy (AFM). AFM images and line scan profiles of the graphene samples $F_1$, $F_2$, $R_1$, and $R_2$ over a scanning area of 20 µm×20 µm are shown in FIG. 11. The plan view AFM images of FIGS. 6(a), (c), (e), and (g) indicate significant roughness for all samples, while the surface topography is further revealed by the line scan profiles of FIGS. 11(b),(d),(f), and (h). As indicated in Table 1 above, $F_1$ has the smallest RMS roughness of ~23 nm, while $F_2$, $R_1$, and $R_2$ have relatively larger values of ~41, 66 and 70 nm, respectively. The initial roughness RMS of the pristine bare SiC was ~3.8 nm.

The sheet resistances of the graphene on SiC/Si and the reference SiC/Si wafer were measured using macroscopic Van der Pauw structures over an area of 1×2 cm$^2$. Sheet resistance classically represents a measure of the resistance of a thin film of uniform thickness, and is useful in the assessment of the electrical conduction of thin films.

Electrochemical Analysis

All samples (1×2 cm$^2$) were dried and used as working electrodes with a Ag/AgCl reference electrode and a platinum counter electrode in a three-electrode cell configuration. Electrochemical tests were performed in a 3 M KCl aqueous electrolyte. Cyclic voltammetry (CV) tests were carried out at a voltage range of 0 to 0.8 V (against Ag/AgCl) on a Princeton Applied Research VersaSTAT 4 potentiostat unit. The scan rates ranged from 5, 10, 20, 50 to 100 mVs$^{-1}$. Electrochemical Impedance Spectroscopy (EIS) was performed on the same instrument over a frequency range of 100 kHz to 100 MHz, with an alternating current amplitude of 10 mV. Galvanostatic charge and discharge performance was evaluated using a Radiometer Analytical Voltalab 40 device at current densities of 1, 2, 3, and 4 µA cm$^{-2}$.

Figure 12:
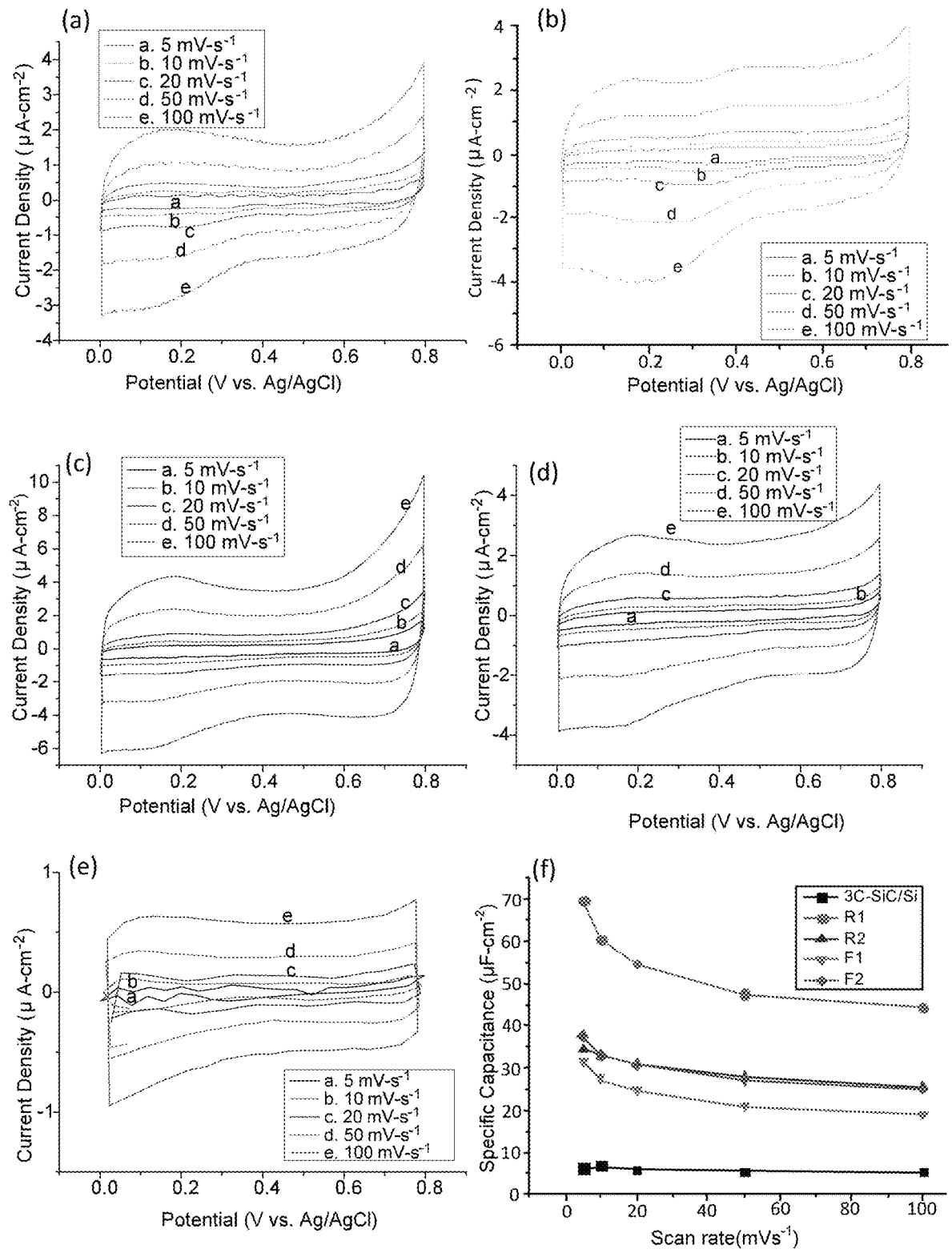
FIG. 12 includes five CV curves of (a) $F_1$, (b) $F_2$, (c) $R_1$, (d) $R_2$, and (e) reference SiC/Si samples in 3 M KCl at scan rates of 10-100 mV s$^{-1}$, and (f) a graph of capacitance as a function of scan rate for each sample.

Cyclic Voltammetry (CV) curves of $F_1$, $F_2$, $R_1$, $R_2$ and reference SiC/Si samples at different sweep rates are shown in FIGS. 12 (a)-(e), respectively. All of these data sets present an ideal rectangular shape, indicating a pre-dominant double-layer storage mechanism. Each electrode shows similar CV curves at various scanning rates, exhibiting high reversibility of the double-layer behaviours. Minor redox couples appear at ~0.2 V, possibly due to impurity residue resulting from the etching process. All the annealed (i.e., thermally processed) samples have much higher responsive current densities along the voltage scan region, indicating a much higher capacitance over the reference SiC/Si, which delivers rather limited capacitance. The enhanced electrochemical behaviours of the annealed SiC/Si samples are credited to the grown graphene layers, which store ionic charge on their surface. The specific capacitance of $F_1$, $F_2$, $R_1$, $R_2$ and reference SiC/Si samples against scan rates is plotted in FIG. 12(f), where $R_1$ exhibits the best capacitive performance. The maximum areal capacitances (i.e., capacitance per unit area) were respectively 31.8, 37.5, 69.5, 34.4 and 6.2 µF cm$^{-2}$ for $F_1$, $F_2$, $R_1$, $R_2$ and reference SiC/Si samples, at a scan rate of 5 mV s$^{-1}$.

The area capacitance ($C_A$, F cm$^{-2}$) was converted to gravimetric capacitance ($C_G$, F g$^{-1}$) as follows:

$$C_G = \frac{C_A}{\frac{\rho_a}{N_A} \cdot M_C \cdot t} \quad (3)$$

where $\rho_a$ is the atomic areal density of monolayer graphene (3.8×10$^{15}$ atoms cm$^{-2}$); $N_A$ is Avogadro's Constant (6.022×10$^{23}$ mol$^{-1}$); $M_C$ is the molar mass of carbon (12.01 g mol$^{-1}$), and t is the number of graphene layers as obtained from Equation (2). The values of the areal and gravimetric capacitance at a scan rate of 5 mV s$^{-1}$, as well as the sheet resistance, RMS roughness (Rq, nm), and the number of graphene layers from XPS of each sample are listed in Table 1.

Figure 13:
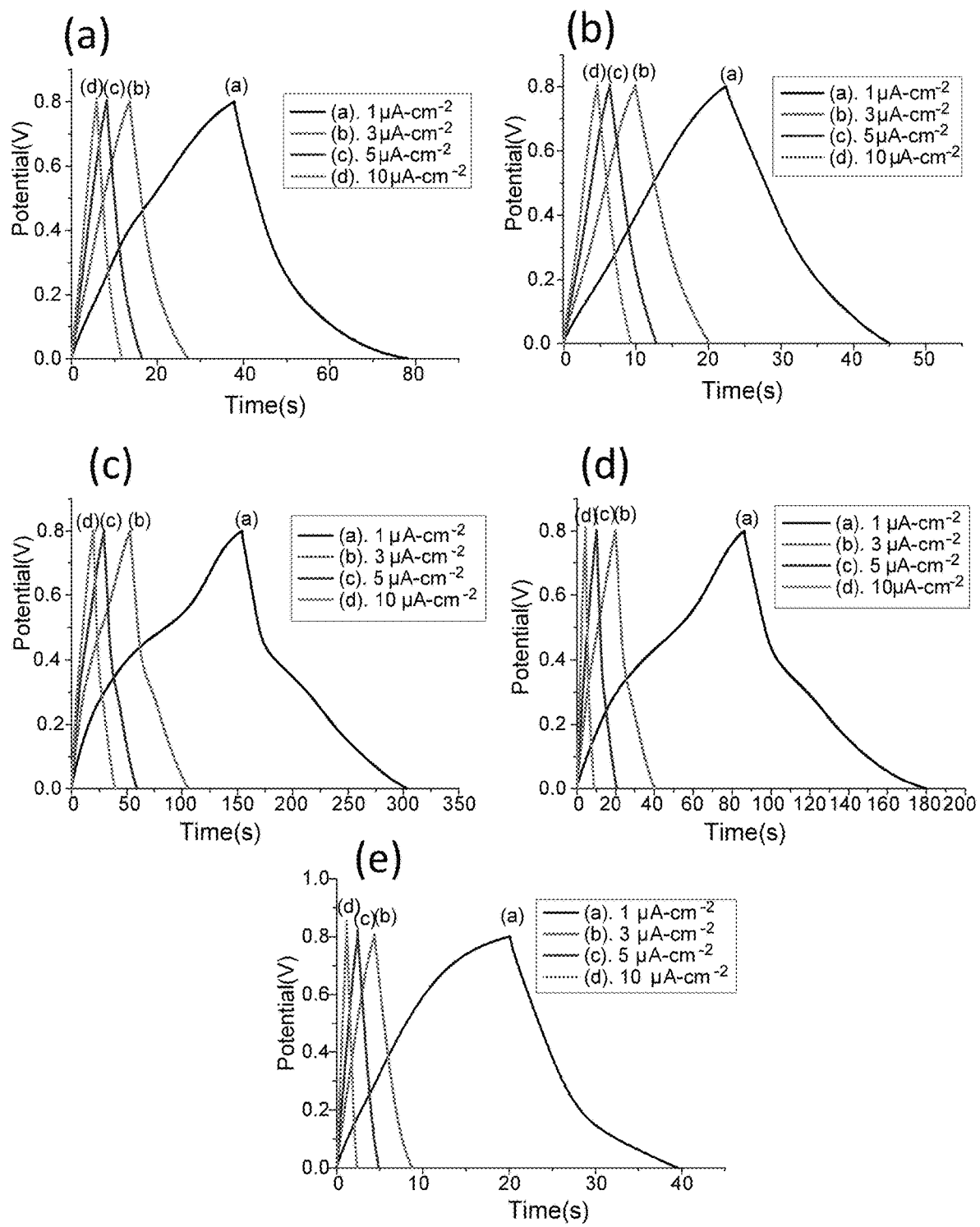
FIG. 13 includes five galvanostatic charge-discharge curves of (a) $F_1$, (b) $F_2$, (c) $R_1$, (d) $R_2$, and (e) reference SiC/Si samples in 3 M KCl at current areal densities of 1-5 μA cm$^{-2}$.

The galvanostatic charge-discharge (GC) curves of $F_1$, $F_2$, $R_1$, $R_2$ and reference SiC/Si electrodes are shown in FIGS. 13 (a) to (e), respectively. All the GC curves have a generally triangular shape without any obvious IR (Ohmic) drops, suggesting excellent electrochemical performance of these electrodes. The charge part of each curve is nearly symmetric to its corresponding discharge part of the same curve in the investigated potential range, indicating high reversibility between the charge and discharge processes. The $R_1$ electrode (FIG. 13(c)) has the longest discharge time at each current density, and yields the highest areal capacitance among all the electrodes.

Figure 14:
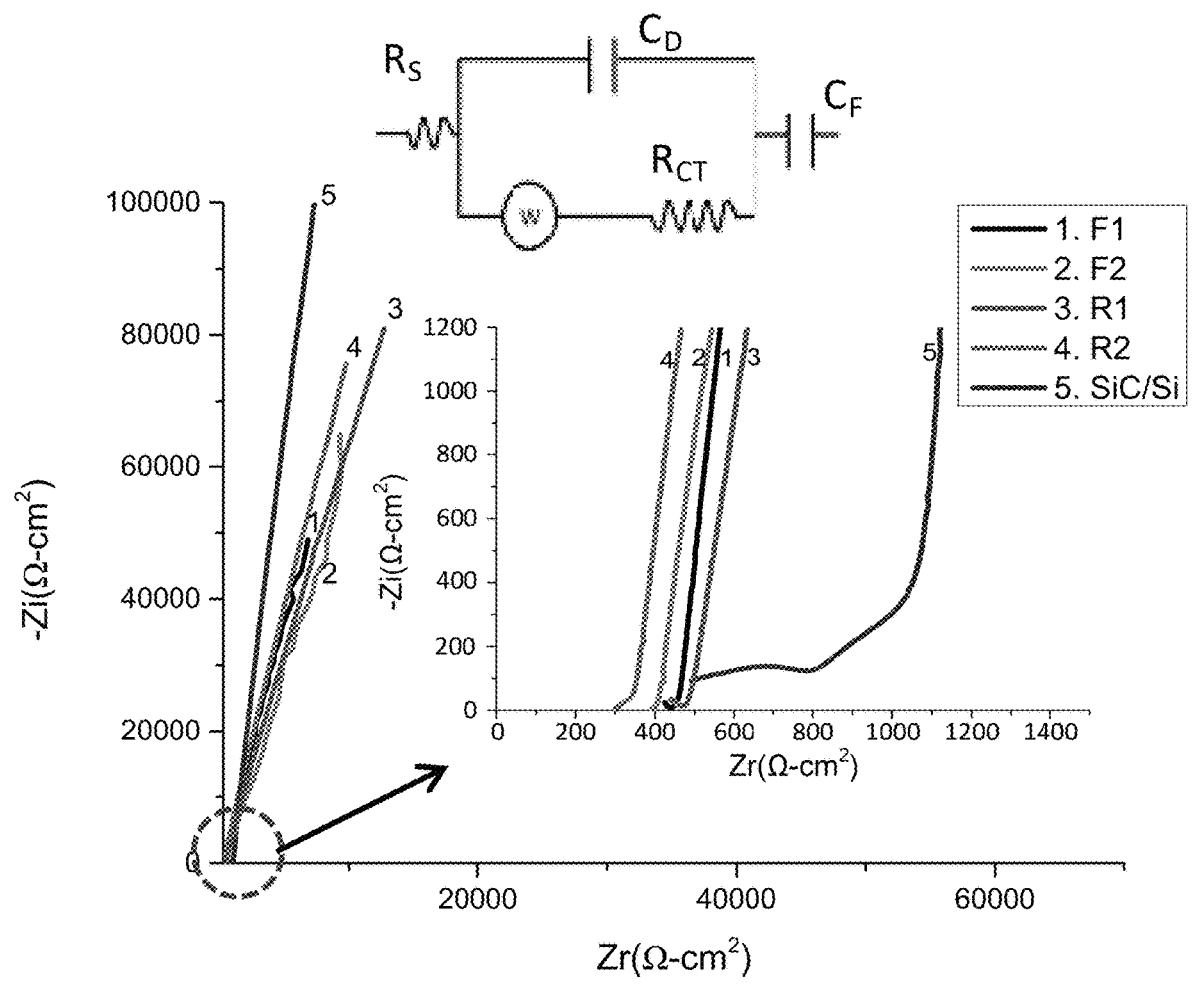
FIG. 14 Nyquist plots for graphene samples $F_1$, $F_2$, $R_1$, $R_2$ and the reference SiC/Si sample, also showing the equivalent circuit and a magnified view of the Nyquist plots in the high frequency region.

Electrochemical Impedance Spectroscopy (EIS) is a technique used to assess the internal resistance of supercapacitors. FIG. 14 is a graph showing Nyquist plots of $F_1$, $F_2$, $R_1$, $R_2$ and reference SiC/Si electrodes in a 3 M KCl electrolyte solution. The equivalent circuit model is shown in an inset to the FIG. 14, where Rs is the electrolyte resistance (which includes the electrode resistance, the bulk electrolyte resistance and the resistance at the electrolyte/electrode interface), $C_D$ is the double layer capacitance, $R_{CT}$ is the charge transfer resistance, W is the Warburg impedance, and $C_F$ is the Faradic pseudo-capacitance.

All the Nyquist plots exhibit nearly vertical slopes in the low frequency region, indicating good capacitor behaviour of all supercapacitor cells. The intercept of the real part of the axis in the high frequency region, as seen in the magnified view in the inset of FIG. 14, indicates the electrolyte resistance ($R_s$). All graphene samples were found to have much smaller values of $R_s$ than the reference SiC/Si sample, showing a much improved bulk electrolyte resistance, in good agreement with their much decreased sheet resistance.

As known by those skilled in the art of electrochemical impedance spectroscopy, the impedance curves begin with an approximately semicircular portion and then become generally linear. The semicircular regions on the plot reveal the charge transfer resistance ($R_{CT}$); the reference SiC/Si sample has a larger semicircular portion than the curves for the other four catalytic graphene samples (which are not visible at the scale shown), indicative for a much larger $R_{CT}$, which is related to the low carrier doping and leads to limited capacitance. As high-quality graphene forms on the SiC/Si wafers, the charge transfer resistance of the cell is further decreased, as evidenced by the presence of smaller semicircles. These EIS results further confirm the improved conductivity of the supercapacitor cell with the catalytic graphene-on-chip electrodes, which deliver enhanced electrochemical performance compared to the reference SiC/Si.

Table 1 above summarizes the measured physical, electrical, chemical and electrochemical properties of the graphene samples and the corresponding SiC reference sample. These stand-alone graphene-on-chip electrodes are free of conductive additives and binders, and the double-layer capacitance of these electrodes is only dependent on the quality and the accessible surface area of the active material (graphene) on the electrodes.

It is clear that $R_1$ has the best electrochemical performance in terms of areal capacitance (69.5 µF cm$^{-2}$) and gravimetric capacitance (65.0 F g$^{-1}$) among all of the graphene samples. This can be ascribed to its low sheet resistance (80Ω/□), as evidenced by the much decreased electrolyte resistance in FIG. 12, and the large RMS roughness (66 nm), which results in a larger surface area to facilitate charge storage on the graphene surface.

Sample $F_2$ has similar sheet resistance (80Ω/□) and numbers of graphene layers (13.7 vs. 14.1) as sample $R_1$, but its electrochemical properties are much poorer than $R_1$, owing to its smaller RMS roughness (41 nm), which provides a lower accessible surface area. $R_2$ has similar values of $I_D/I_G$ (=0.7) and RMS roughness (70 nm vs. 66 nm) compared to $R_1$, but yields lower area capacitance and gravimetric capacitance, which can be attributed to its larger sheet resistance (236Ω/□). Similarly, sample $F_1$ has worse electrochemical properties than $R_1$, also due to its larger sheet resistance (680Ω/□) and smaller RMS roughness (23 nm) with a smaller surface area.

The $I_D/I_G$ values in Table 1 indicate the quality of the graphene samples in terms of defectivity. However, even with a higher $I_D/I_G$ value of 1.2, the sheet resistance of graphene is still as low as 80Ω in the case of $F_2$. This indicates that the graphene defectivity as estimated with Raman spectroscopy in the investigated range does not correlate with the measured sheet resistance. The likely reason for the larger sheet resistance of $R_2$ and $F_1$, compared to that of $R_1$ and $F_2$, is a different degree of continuity or coverage of the different graphene films, an attribute not captured by the Raman measurements.

Sample $R_1$, with ~14 graphene layers, delivers the best areal capacitance, whereas $R_2$ with ~25 layers shows the worst gravimetric capacitance, revealing that a larger number of graphene layers do not translate into better electrochemical performance. This may be because only a few top graphene layers are fully accessible for electrochemical double-layer charge storage, and thus determine the overall capacitance.

The described embodiments of the present invention include processes that simultaneously form porous SiC and high-quality graphene on the porous SiC, using a metal-assisted catalytic process. The resulting graphene samples have high surface areas due to extensive pitting of the underlying SiC, and display typical supercapacitive behaviours as stand-alone on-chip electrodes, with specific capacitances up to 65.0 F $g^{-1}$ (or 69.5 µF $cm^{-2}$). The electrochemical performance of these on-chip electrodes is closely related to the surface area and the quality and coverage of the synthesised graphene layers, as indicated by the measured sheet resistance values.

The described processes for forming graphene are transfer-free and can eliminate the use of conductive additives and/or binders for electrochemical applications. By combining these processes with patterning (e.g., to form an inter-digitated finger structure), the described processes can be used to create micro-scale supercapacitors on low cost (e.g., silicon) substrates, enabling energy storage at the wafer level and numerous opportunities for on-chip integrated energy storage applications.

EXAMPLE II

An epitaxial 3C—SiC layer (500 nm) with an unintentional n-type doping of $10^{16}$-$10^{17}$ $cm^{-3}$ was initially grown on a Si (100) wafer. A thin nickel film (~2 nm) was sputtered onto this 3C—SiC/Si wafer by using a DC $Ar^+$ ion sputterer (deposition current of 100 mA and base pressure of $8\times10^{-2}$ mbar) and transferred into a tube furnace. The coated 3C—SiC/Si wafer was annealed for 2 h under vacuum with a temperature ramping rate of ~25° C. $min^{-1}$ at 1000-1200° C. The graphitized samples were allowed to cool down to room temperature and immersed in Freckle solution (70:10: 5:5:10-85% $H_3PO_4$:Glacial acetic acid:70% $HNO_3$:50% $HBF_4$:$H_2O$) overnight to eliminate nickel silicides and unreacted nickel. This whole process was repeated for three times to produce samples of graphene on porous SiC.

All electrochemical measurements were conducted on an Electrochemistry Workstation (CHI660E) in the presence of a 3 M KCl aqueous electrolyte. The CV tests were carried out in a voltage range of ~-0.2 to 0.8 V (against SCE) from 10-100 mV $s^{-1}$. Galvanostatic charge-discharge (GC) performance was evaluated at current densities of 3-10 µA $cm^{-2}$. The cyclic stability of a representative sample was examined at the current density of 10 µA $cm^{-2}$ for 10,000 cycles.

Figure 19:
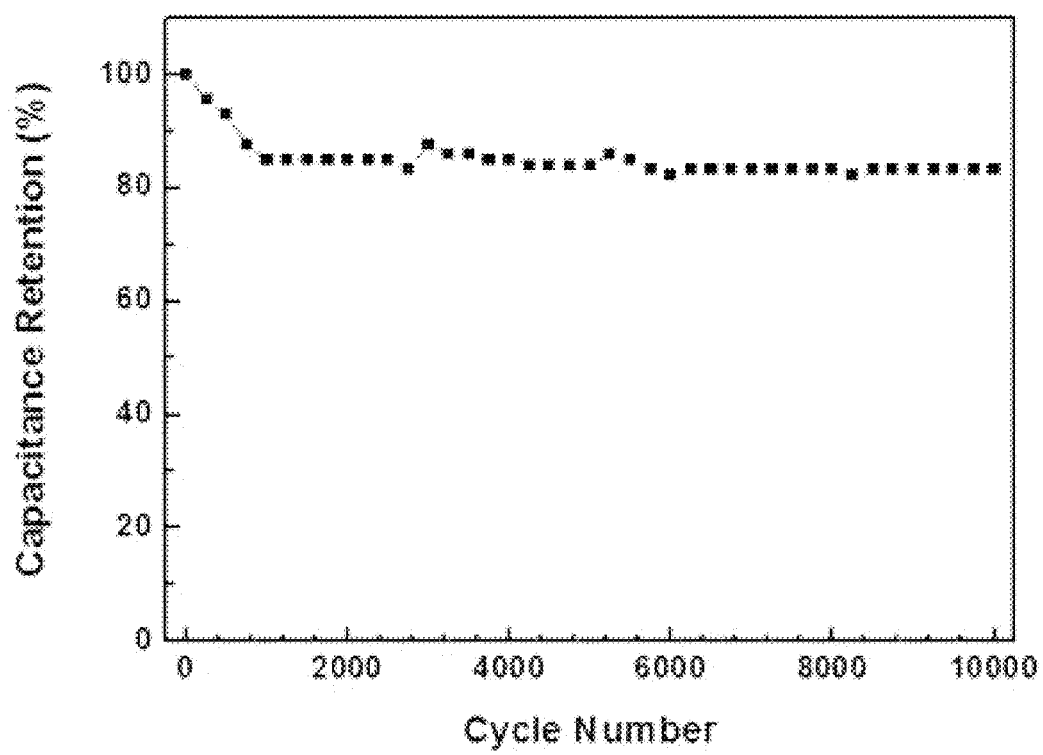
FIG. 19 is a graph illustrating the long-term cycling test of a cell at a current density of 10 μA cm$^{-2}$.

The long-term cycling test of this representative sample at a current rate of 10 µA $cm^{-2}$ is shown in FIG. 19. The sample electrode experiences dramatic capacitance decay in the first 1,000 cycles, and maintains excellent cycling stability throughout the remaining 9,000 cycles. A capacitance retention rate of 83.2% is obtained for 10,000 continuous charge-discharge cycles.

Some of the samples were then subjected to etching in an $O_2$ plasma to remove the graphene surface layer.

Figure 15:
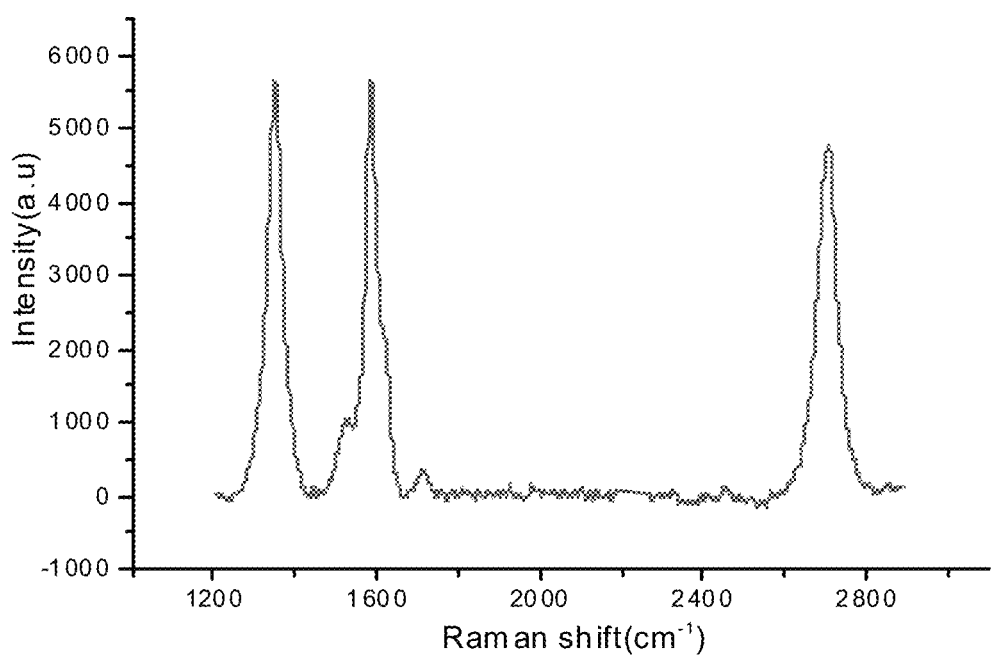
FIGS. 15 and 16 are graphs showing Raman spectra from a processed sample, before and after removing the surface graphene layer.
Figure 16:
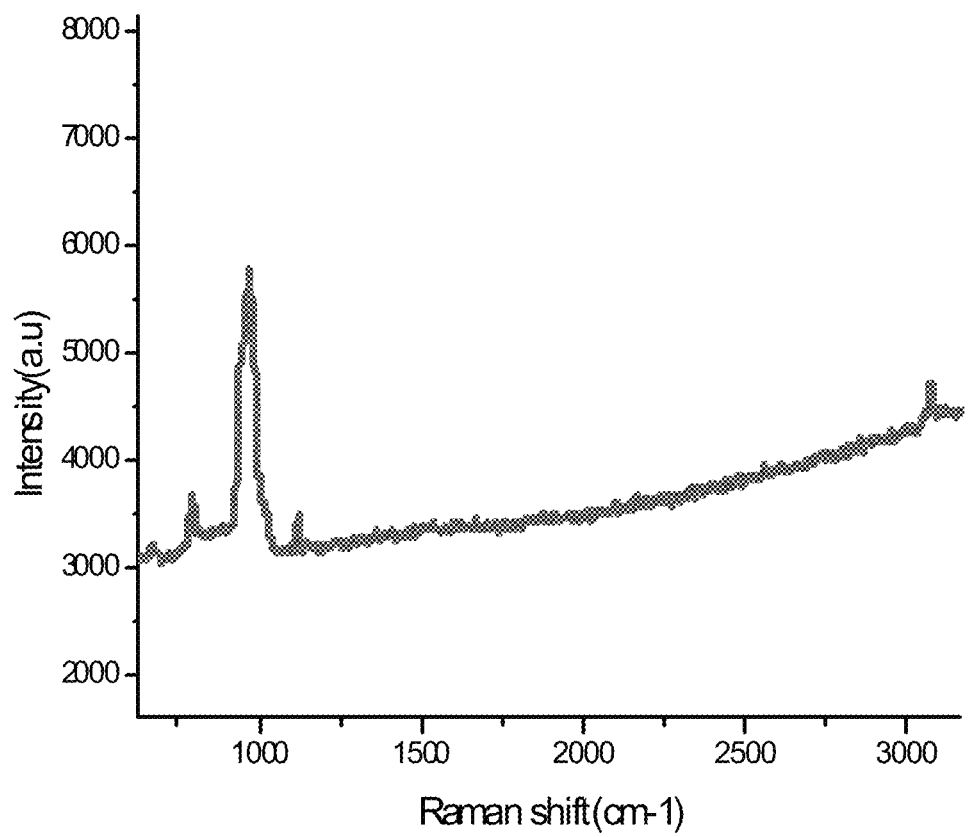

FIGS. 15 and 16 are graphs showing Raman spectra from one of the processed samples, before and after the graphene etching step, confirming the initial presence of graphene, and its subsequent removal by etching.

Three all-solid-state supercapacitor cells were produced using two identical graphene, etched, or reference 3C—SiC/Si samples arranged face-to-face and a layer of a gel electrolyte in a two-electrode configuration. The gel electrolyte was prepared by mixing 0.03 g of fumed silica and 1.0 g of the ionic liquid, 1-butyl-3-methylimidazolium bif (trifluoromethylsulfonyl)imide. The all-solid-state cells were left for 2 h prior to the measurements.

Figure 17:
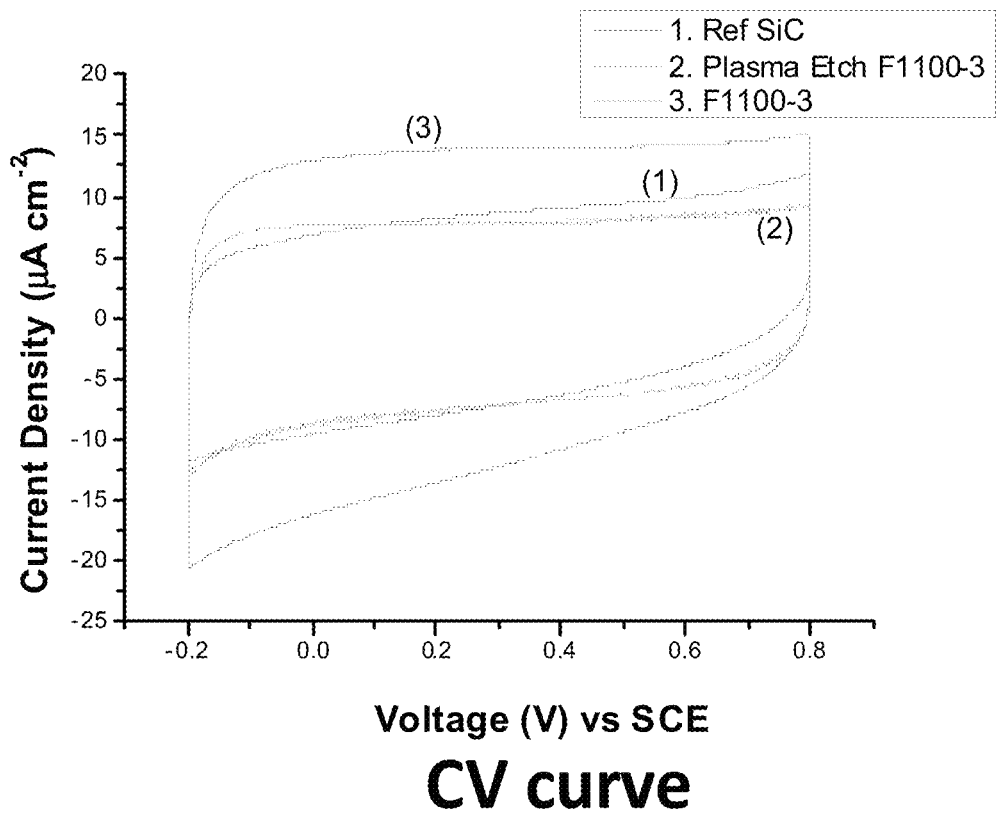
FIG. 17 is a graph showing Cyclic Voltammetry (CV) curves from cells formed from three types of sample (see text for details)

FIG. 17 is a graph showing Cyclic Voltammetry (CV) curves from the three cells. The CV data for the etched SiC sample is similar to that from the reference SiC sample, despite the very different surface morphologies of the two samples (planar vs highly textured/rough/porous). The graphene electrode exhibits quasi-rectangular shape at various scanning rates throughout a potential window of 2 V, verifying a double-layer behaviour with high reversibility. The reference 3C—SiC/Si electrode shows CV curves with a similar shape, but much smaller responsive current density, implying inferior performance.

Figure 18:
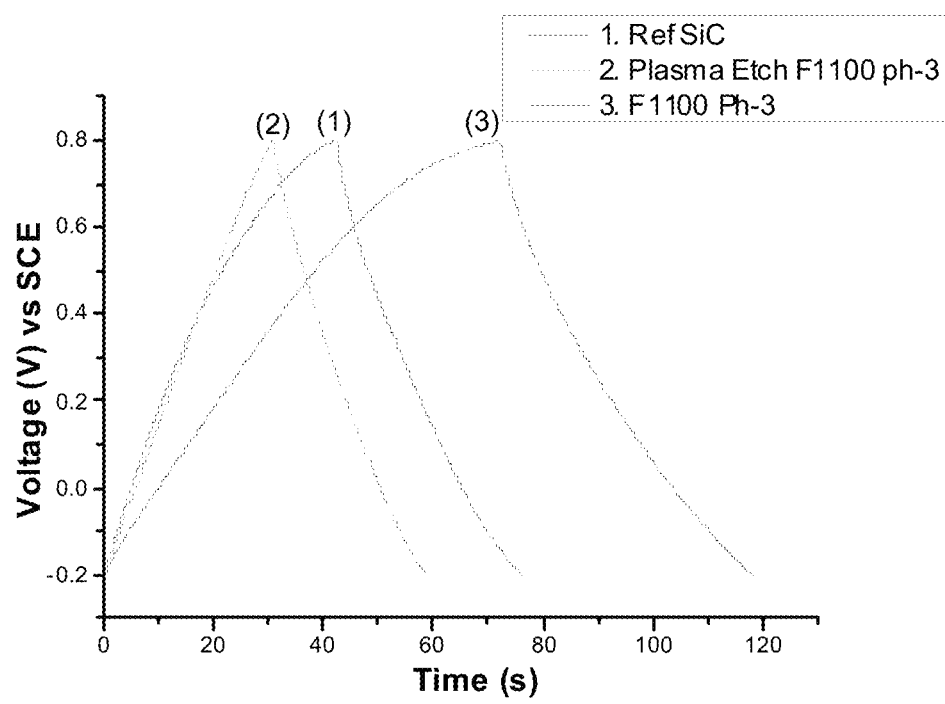
FIG. 18 is a graph showing galvanostatic charge and discharge curves from the same three cells.

FIG. 18 is a graph showing galvanostatic charge and discharge curves from the same three cells. In typical charge and discharge processes, all three cells show triangular-shaped curves with no obvious IR drop. Significantly, the cell formed from the etched samples behaves similarly to the cell formed from reference samples, whereas the cell formed from graphene samples has a significantly slower charge and discharge cycle, indicating higher capacitance, and confirming that the graphene is required to achieve this improved result.

TABLE 2

Areal capacitances of cells formed using unprocessed reference SiC, processed (high surface area graphene electrodes), and processed + etched (graphene removed, high surface area SiC only) samples, respectively.

| Sample | Areal Capacitance (F/cm2) |
| --- | --- |
| Ref SiC | 86 |
| F1100-3 (porous graphene) | 139 |
| Plasma Etch F1100-3 (porous/rough SiC) | 84 |

Many modifications will be apparent to those skilled in the art without departing from the scope of the present invention.

The invention claimed is:

1. A process for forming high surface area graphene structures, the process comprising:
   (i) depositing a thin film of elemental nickel on a surface of silicon carbide;
   (ii) heating the elemental nickel and the silicon carbide to cause the deposited elemental nickel to react with a portion of the silicon carbide to form silicide regions extending into an unreacted portion of the silicon carbide and graphene disposed between the silicide regions and the unreacted portion of the silicon carbide;
   (iii) removing the silicide regions to provide a silicon carbide structure having a rough or porous surface and a surface layer of graphene; and
   (iv) repeating steps (i) to (iii) one or more times to increase the roughness or porosity of the surface layer of graphene.

2. The process of claim 1, wherein the silicon carbide is initially in the form of a thin film of silicon carbide supported by a substrate.

3. The process of claim 2, wherein, prior to said depositing, the method comprises patterning the thin film of silicon carbide so that, after said steps of depositing, heating and removing, the silicon carbide structure is in a form of mutually spaced electrodes having a porous surface and a conformal surface layer of graphene.

4. The process of claim 3, wherein the electrodes are in the form of interdigitated finger electrodes.

5. The process of claim 3, comprising introducing an electrolyte into a region between the mutually spaced electrodes to form a supercapacitor.

6. The process of claim 5, wherein the electrolyte is a gel electrolyte.

7. The process of claim 1, wherein the deposited nickel has a thickness of about 2 nanometers.

* * * * *